United States Patent
Kurapov et al.

(10) Patent No.: US 9,840,768 B2
(45) Date of Patent: Dec. 12, 2017

(54) Ti$_x$Si$_{1-x}$N LAYERS AND THEIR PRODUCTION

(71) Applicant: Oerlikon Surface Solutions AG, Trübbach, Trübbach (CH)

(72) Inventors: Denis Kurapov, Walenstadt (CH); Siegfried Krassnitzer, Feldkirch (AT)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 0 days.

(21) Appl. No.: 14/902,826

(22) PCT Filed: Jul. 1, 2014

(86) PCT No.: PCT/EP2014/001792
§ 371 (c)(1),
(2) Date: Jan. 4, 2016

(87) PCT Pub. No.: WO2015/000581
PCT Pub. Date: Jan. 8, 2015

(65) Prior Publication Data
US 2016/0177436 A1    Jun. 23, 2016

(30) Foreign Application Priority Data

Jul. 3, 2013  (DE) .................. 10 2013 011 071
Jul. 3, 2013  (DE) .................. 10 2013 011 073

(51) Int. Cl.
*C23C 14/06*    (2006.01)
*C23C 14/34*    (2006.01)
(Continued)

(52) U.S. Cl.
CPC ........ *C23C 14/3407* (2013.01); *C23C 14/027* (2013.01); *C23C 14/0641* (2013.01);
(Continued)

(58) Field of Classification Search
USPC .................. 51/307, 309; 428/697, 698, 699; 204/192, 192.15, 192.16
See application file for complete search history.

(56) References Cited

U.S. PATENT DOCUMENTS 6,162,500 A      12/2000  Erbslöh et al.
7,060,345 B2 *   6/2006   Fukui .................. C23C 14/0635
                                                                    428/697
(Continued)

FOREIGN PATENT DOCUMENTS

CN    101151397 A    3/2008
CN    101326303 A    12/2008
(Continued)

OTHER PUBLICATIONS

Vaz et al.: "Structural Analysis of Ti1—xSixNy Nanocomposite Films Prepared by Reactive Magnetron Sputtering," Surface & Coatings Technology, vol. 120-121; Nov. 1, 1999; pp. 166-172.
(Continued)

*Primary Examiner* — Archene Turner

(57) ABSTRACT

A workpiece having a coating, said coating comprising at least one Ti$_x$Si$_{1-x}$N layer, characterized in that x≤0.85 and the Ti$_x$Si$_{1-x}$N layer contains nanocrystals, the nanocrystals present having an average grain size of not more than 15 nm and having a (200) texture. The invention also relates to a process for producing the aforementioned layer, characterized in that the layer is produced using a sputtering process, in which current densities of greater than 0.2 A/cm$^2$ arise on the target surface of the sputtering target, and the target is a Ti$_x$Si$_{1-x}$N target, where x≤0.85. An intermediate layer containing TiAlN or CrAlN is preferably provided between the Ti$_x$Si$_{1-x}$N layer and the substrate body of the workpiece.

8 Claims, 4 Drawing Sheets

(51) Int. Cl.
*C23C 14/02* (2006.01)
*C23C 14/35* (2006.01)

(52) U.S. Cl.
CPC ...... *C23C 14/0682* (2013.01); *C23C 14/3485* (2013.01); *C23C 14/35* (2013.01); *C23C 14/352* (2013.01)

(56) References Cited

U.S. PATENT DOCUMENTS

| | | | |
|---|---|---|---|
| 7,348,074 B2 * | 3/2008 | Derflinger | C23C 14/0641 428/216 |
| 7,592,076 B2 * | 9/2009 | Flink | C23C 14/0641 428/697 |
| 7,790,003 B2 * | 9/2010 | Chiang | C23C 14/046 204/192.16 |
| 7,939,172 B2 * | 5/2011 | Gorokhovsky | C23C 14/024 428/698 |
| 8,034,459 B2 * | 10/2011 | Wei | C23C 8/02 204/192.15 |
| 8,304,098 B2 | 11/2012 | Kubota et al. | |
| 2004/0018393 A1 | 1/2004 | Fukui et al. | |
| 2006/0147728 A1 | 7/2006 | Shen et al. | |
| 2008/0166583 A1 * | 7/2008 | Astrand | C23C 14/0641 428/602 |
| 2010/0215912 A1 * | 8/2010 | Kubota | C23C 14/0641 428/336 |
| 2010/0215951 A1 | 8/2010 | Shibata et al. | |
| 2010/0236919 A1 * | 9/2010 | Alami | C23C 14/35 204/192.12 |
| 2011/0171444 A1 | 7/2011 | Elkouby et al. | |
| 2011/0293909 A1 | 12/2011 | Ni et al. | |
| 2012/0090247 A1 * | 4/2012 | Miura | C23C 14/0036 51/309 |
| 2012/0114437 A1 | 5/2012 | Andersson et al. | |
| 2013/0108850 A1 * | 5/2013 | Kudo | C04B 35/5831 428/216 |

FOREIGN PATENT DOCUMENTS

| | | |
|---|---|---|
| CN | 101855035 A | 10/2016 |
| DE | 102011053372 A1 | 3/2013 |
| DE | 102011117177 A1 | 5/2013 |
| DE | 102010034321 A1 | 1/2014 |
| EP | 2410072 A1 | 1/2012 |
| EP | 2208560 B1 | 9/2013 |
| EP | 2644300 A1 | 10/2013 |
| JP | 2002028804 A | 1/2002 |
| JP | 2008534297 A | 8/2008 |
| JP | 2011-167793 * | 9/2011 |
| JP | 2011527383 A | 10/2011 |
| WO | 2005010225 A1 | 2/2005 |
| WO | 2006102780 A1 | 10/2006 |
| WO | 2011/131756 * | 10/2011 |
| WO | 2013060415 A1 | 5/2013 |
| WO | 2013083238 A1 | 6/2013 |

OTHER PUBLICATIONS

Shtansky et al.: "Comparative Investigation of Ti—Si—N Films Magnetron Sputtered Using Ti5Si3 + Ti and Ti5Si3 + TiN Targets," Surface & Coatings Technology, vol. 182, No. 2-3; Apr. 1, 2004; pp. 204-214.

Nose et al.: "Influence of Sputtering Conditions on the Structure and Properties of Ti—Si—N Thin Films Prepared by r.f.—Reactive Sputtering," Surface & Coatings Technology, vol. 174, No. 175; Jan. 1, 2003; pp. 261-265.

* cited by examiner

Table 1

| coating | flank wear (μm) | corner wear (μm) |
|---|---|---|
| benchmark | 53.7 | 80.6 |
| TiAlN+TiSiN Ti/Si=90/10 | 45.5 | 61.7 |
| TiAlN+TiSiN Ti/Si=70/30 | 33.1 | 49.6 |

$Ti_xSi_{1-x}N$ LAYERS AND THEIR PRODUCTION

FIELD OF THE INVENTION

The present invention relates to a coating comprising at least one layer containing silicon.

BACKGROUND OF THE INVENTION

Silicon is a chemical element sometimes used together with hard material layers to increase the layer stress. Increasing the layer stress usually leads to an increase in the hardness of the layer. This is used, for example, also in connection with titanium nitride. The resulting layers can be chemically described by the structural formula $Ti_xSi_{1-x}N$, wherein x is the concentration of Ti expressed in at % when only metallic elements are taken into consideration. When written in this way, the atomic concentrations indicated in percent add up to 100%.

Such layers can be produced in extremely hard form by means of the so-called cathodic spark evaporation. Herein, a spark is ignited between a target providing the metallic elements, which is used as the cathode, and an anode, by means of which a high-density electron stream is extracted from the target surface. Due to the extremely localized, very high current density at the target surface, the target surface is locally overheated and the material evaporates in ionized form.

The material thus evaporated in ionized form is then accelerated toward the substrates with the aid of a negative voltage applied to the substrates. If a reactive gas is additionally introduced into the coating chamber, the evaporated ions combine with the reactive was and form a corresponding coating on the substrate surface.

However, in this method the so-called droplet problem can frequently be observed: the sudden local heating on the target surface causes an explosive melting to occur, by which whole drops of the target material are propelled into the surrounding area. Some of these drops then come to lie on the substrate surface generally resulting in negative effects on the layer properties and their quality. While there are meanwhile methods to filter out these droplets, such filters dramatically reduce the coating rate, and it becomes virtually impossible to operate the coating process economically.

On the other hand, a silicon content of greater than 15 at % very often leads to damage to the target during spark evaporation. In extreme cases, the target has to be exchanged after each coating process, again reducing the economic viability of the process.

In the case of conventional deposition from the gas phase by means of evaporation with magnetron support (magnetron sputtering) the person skilled in the art does not have to contend with these problems. However, the particles chipped out of the target surface by means of ion bombardment, are not ionized or ionized to a very limited extent, and can thus not be accelerated toward the substrates by means of a substrate bias applied to the substrates. As a consequence, the layers sputtered in the conventional manner have relatively low density and hardness.

A well-known approach to achieve densities and hardnesses of sputtered layers similar to those achieved with the spark evaporation method, is the so-called HiPIMS method (HiPIMS=high power impulse magnetron sputtering). In this sputtering method, high power pulse densities are applied to a sputtering cathode, which results in the material sputtered by the cathode being ionized to a high percentage. If a negative voltage is now applied to the workpieces to be coated, these ions are accelerated towards the workpieces leading to very high-density layers.

The power applied to the sputtering cathode must be applied in a pulsed fashion to give it time to dissipate the heat introduced together with the power. In the HiPIMS method a pulse generator is thus needed as the power source. This pulse generator has to be capable of outputting very high power pulses, which are, however, very short. The pulse generators available today have little flexibility for example with regard to the pulse height and/or pulse duration. Ideally, a square-wave pulse should be output. However, the power output within a pulse is generally highly dependent on time, which has an immediate effect on the layer properties, such as hardness, adhesion, residual stress et cetera. Moreover, the coating rate is negatively affected by the deviation from the square wave profile.

These problems, in particular, raise questions with respect to the reproducibility.

As far as the inventors know, attempts have not yet been made to produce $Ti_xSi_{1-x}N$ layers by means of the HiPIMS method.

There is therefore a need fix a method according to which $Ti_xSi_{1-x}N$ layers can be produced by means of magnetron sputtering with high power.

SUMMARY OF THE INVENTION

According to the invention, the layers are produced by means of a sputtering method, in which the power source constantly outputs high power.

DETAILED DESCRIPTION OF THE PREFERRED EMBODIMENTS

A plurality of sputtering cathodes are used herein. Unlike the conventional HiPIMS method, a pulse generator is not used, but rather the full power of the power source and thus a high power density is initially only applied to a first sputtering cathode. Subsequently, a second sputtering cathode is connected to the outputs of the power source. At first, relatively little happens, since the impedance of the second sputtering cathode at this time is substantially higher than the impedance of the first sputtering cathode. Only when the first sputtering cathode is separated from the outputs of the power source is the power substantially output via the second sputtering cathode. The corresponding high-power magnetron sputtering method is more closely described in WO2013060415. Typically, the power source is operated in the order of 60 kW. Typical powers, to which the sputtering cathodes are exposed in the temporal mean, are in the order of 8 kW.

Figure 1:
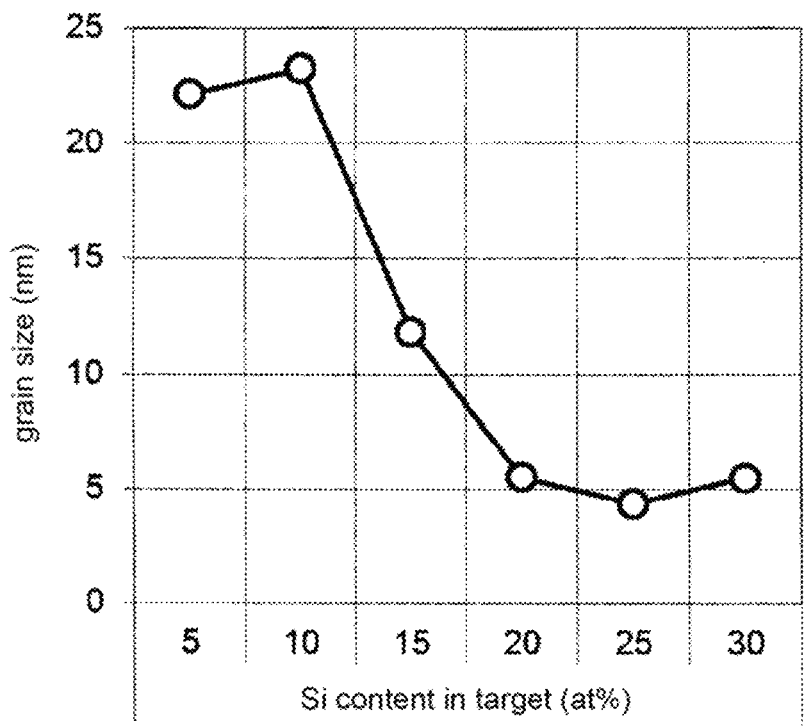
FIG. 1 shows a correlation between Si concentration and average grain size of the nanocrystals.
Figure 2:
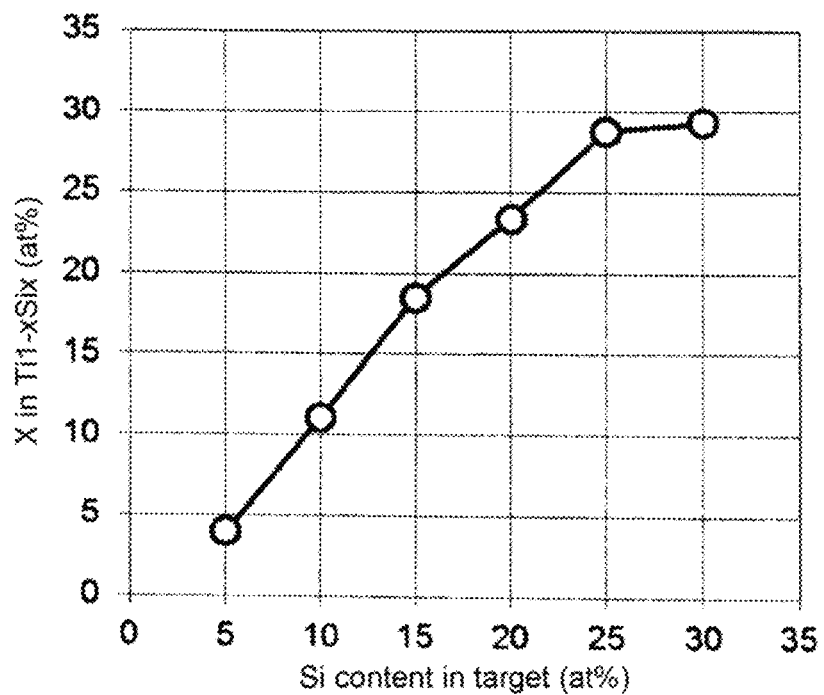
FIG. 2 shows how the concentration conditions in the target used for coating are almost directly reflected in the coated layer.
Figure 7:
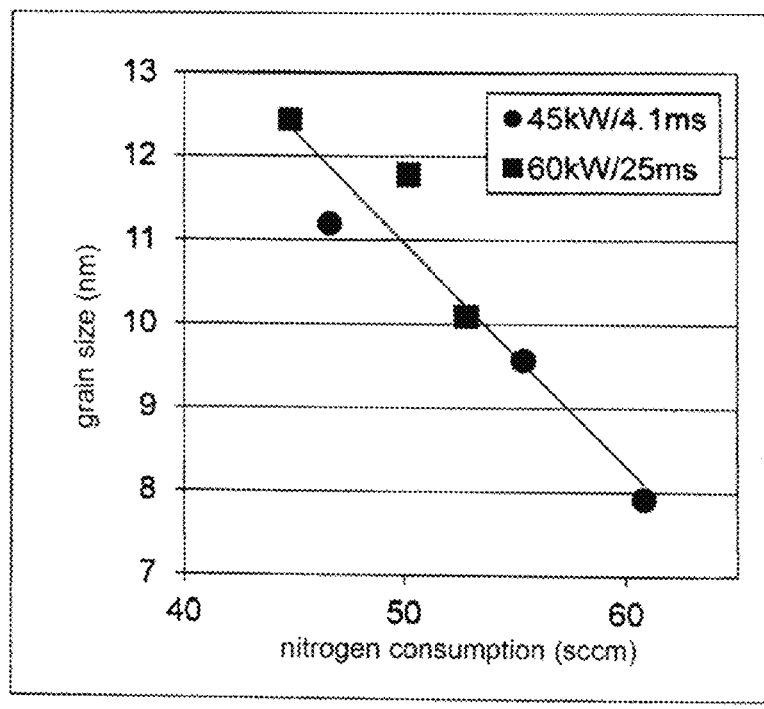
FIG. 7 shows that as soon as a target having a certain Si concentration is selected, the grain size can be finely adjusted by means of the nitrogen consumption.

The inventors have now discovered to their surprise that if operated with TiSi targets having a silicon content of equal to or greater than 15 at %, such a method is capable of producing nanocrystalline layers having very good mechanical properties in a reproducible manner. What is particularly interesting is that with an Si concentration in the target of 15 at % or more, the nanocrystals have an average grain size of less than 15 nm as shown in FIG. 1. FIG. 2 shows how the concentration conditions in the target used for coating are almost directly reflected in the coated layer. It should be noted that as soon as a target having a certain Si concentration is selected, the grain size can be finely adjusted by means of the nitrogen consumption, as shown in FIG. 7.

Figure 3:
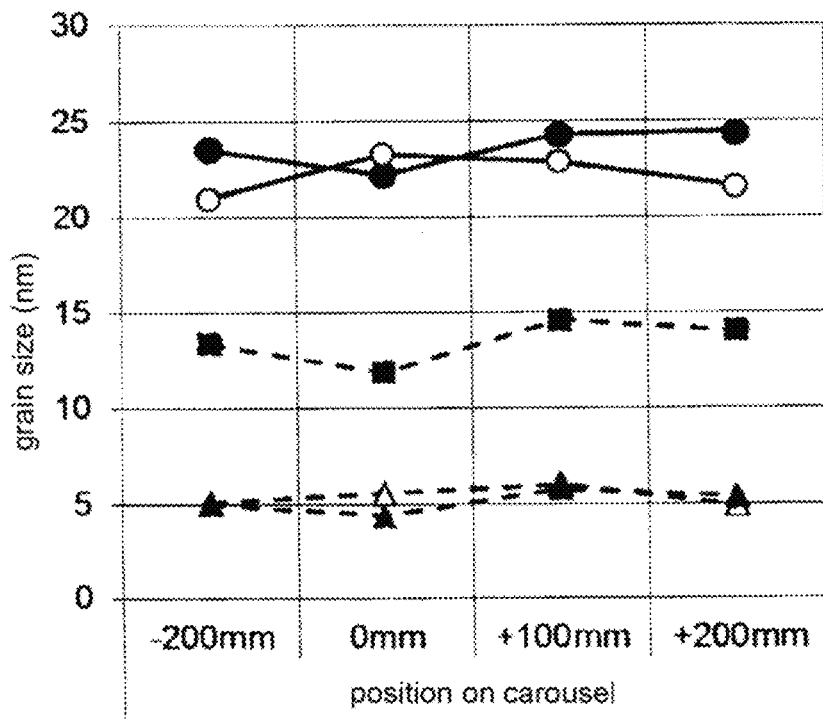
FIG. 3 shows that the grain sizes of layers, which were coated at different positions on a rotating carousel, were maintained.

This is a highly robust phenomenon, as can be seen from FIG. 3. The grain sizes of layers were measured, which were coated at different positions on a rotating carousel. The series of readings with the black filled-in circles refers to a $Ti_{95}Si_5$ target. The series of readings with the white filled-in circles refers to a $Ti_{90}Si_{10}$ target. The series of readings with the black filled-in squares refers to a $Ti_{85}Si_{15}$ target. The series of readings with the white filled-in triangles refers to a $Ti_{80}Si_{20}$ target. The series of readings with the black filled-in triangles refers to a $Ti_{75}Si_{15}$ target. Clearly, the grain size is maintained over the entire coating height of the chamber.

Figure 4:
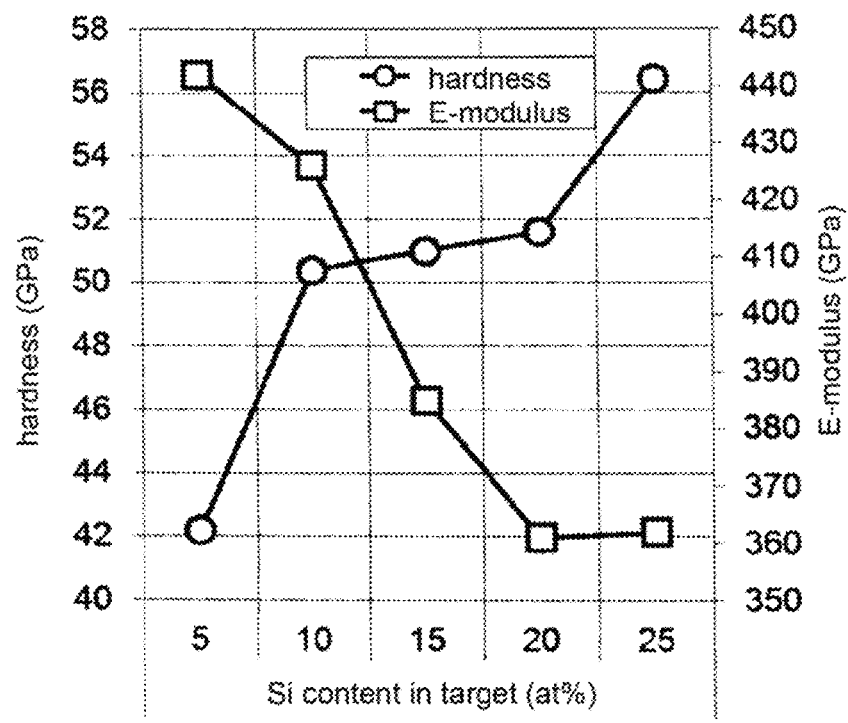
FIG. 4 shows that as the silicon content increases, the layers have increased hardness and reduced E-modulus.

As the silicon content increases, the layers have increased hardness and reduced E-modulus, as shown in FIG. 4. This does not show the concentration ratios within the layers, but the Ti to Si concentration ratio in the targets used for producing the layers.

According to a further embodiment of the present invention, the $Ti_xSi_{1-x}N$ layer with an Si content of at least 15 at % of the metallic component is not applied directly on the substrates to be coated, but rather a TiAlN layer is provided as an intermediate layer between the substrate and the layer according to the present invention. This intermediate layer has the advantage, among others, that it functions as a transition with respect to the stress anchor pressure conditions between the less brittle substrate and the extremely hard $Ti_xSi_{1-x}N$ layer having extremely high residual stresses. Flaking off is thus greatly reduced, and the layer adhesion is correspondingly improved.

Figure 5:
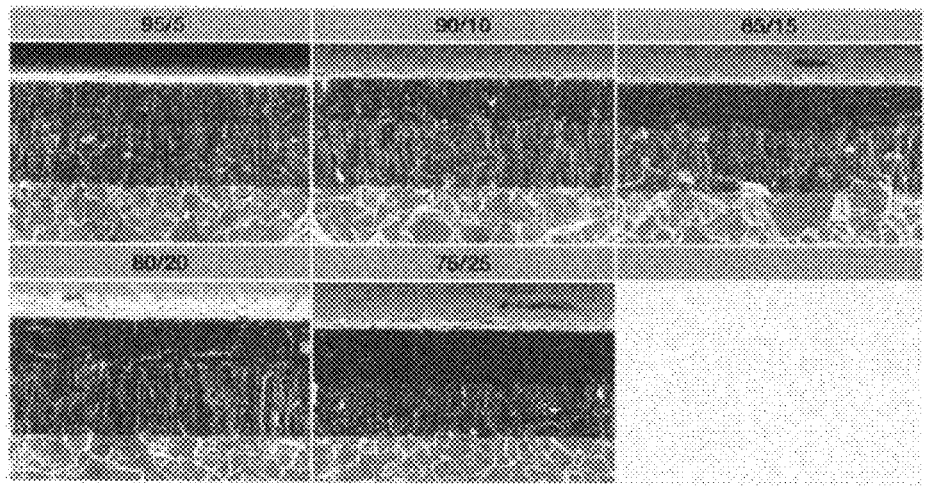
FIG. 5 shows a series of two-layer structures according to the present invention, wherein different targets are used for coating the $Ti_xSi_{1-x}$ layers.

FIG. 5 shows a series of such two-layer structures according to the present invention, wherein, as already discussed, different targets are used for coating the $Ti_xSi_{1-x}$ layers as indicated in the figure. The different structures of the $Ti_xSi_{1-x}$ layers in the series are clearly visible, which become increasingly finer as the Si content increases. In the present example, a target was used for producing the intermediate layer, which comprises 40 at % titanium and 60 at % aluminum. It was established that it was particularly advantageous if the two layers TiAlN and TiSiN have a (200) texture.

Such double layers with different Si content were tested on tools. The machining tests were performed under the following conditions: workpiece steel DIN 1.2344 hardened to 45HRC, tool diameter 10 mm, solid cemented-carbide milling cutter, cutting speed 220 m/mm, feed per tooth 0.1 mm, axial infeed 10 mm, radial infeed 0.5 mm. It was measured how many meters a corresponding tool can machine, without being damaged. Tools coated with the usual commercially available coating survive for just over 200 m. A tool coated with the above-described double layer survives about the same distance, when the outer layer contains only 5% silicon. In contrast, the tests show that the tool can survive for more than 500 m if the outer layer contains at least 15% silicon. Table I shows the wear values measured on the tool after 140 m cutting distance. It can be seen quite clearly that wear is lowest with the coating containing 30% silicon.

Figure 6:
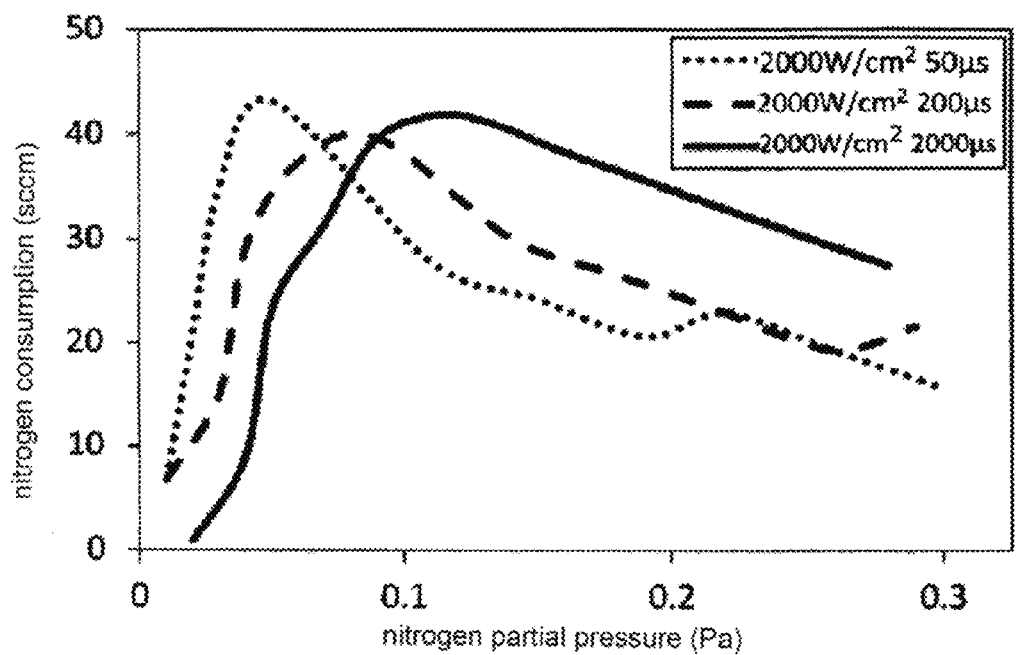
FIG. 6 shows that pulse duration directly influences the position of the corresponding maxima.

According to a further advantageous embodiment, a transition layer is provided between the TiAlN intermediate layer and the $Ti_xSi_{1-x}$ layer, the transition layer being produced by means of co-sputtering. With the above-described sputtering method, co-sputtering can be reliably performed in such a way that, for example, the pulse widths for the different targets are selected in such a way that the maxima of the reactive gas consumption curves as a function of the pressure present in the coating chamber essentially overlie each other. This is possible because the pulse duration directly influences the position of the corresponding maxima. This is shown, for example, in FIG. 6, where three different pulse durations (0.05 ms, 0.2 ms and 2 ms) were used for sputtering. In this way it is possible to optimally operate both targets at the same pressure present in the chamber and under the same gas flow conditions.

According to a further embodiment of the present invention, the transition layer is implemented as a graded layer, having a decreasing content in TiAlN and an increasing content of $Ti_xSi_{1-x}N$ as the distance from the substrate snake increases.

According to a further embodiment of the present invention, the final $Ti_xSi_{1-x}N$ layer is not a pure $Ti_xSi_{1-x}N$ layer but also contains a certain proportion of TiAlN.

According to a further embodiment of the present invention, a first $Ti_xSi_{1-x}$ target and a second $Ti_xSi_{1-z}$ target are used for coating, wherein $0 \leq x \leq 1$ and $0 \leq z \leq 1$, but $z \neq x$, i.e. the first and second targets differ in their compositions and $(x+z)/2 \leq 0.85$, so that further layers having an Si concentration of $\geq 15$ at % can be produced. In the method, both targets can be operated according to the above-described co-sputtering method. This allows the Si concentration to be varied during coating, i.e. to implement an Si concentration gradient.

Furthermore, the inventors established that surprisingly excellent layer performances can be achieved with the layers deposited according to the present invention by the use of a $Cr_yAl_{1-y}N$ layer as an intermediate layer. Accordingly, further preferred embodiments of the present invention will be described in the following, which comprise $Cr_yAl_{1-y}N$ layers as intermediate layers.

According to a further embodiment of the present invention, the $Ti_xSi_{1-x}N$ layer having an Si content of at least 15 at % of the metallic, components is not applied directly on the substrate to be coated, but rather a $Cr_yAl_{1-y}N$ layer is provided as an intermediate layer between the substrate and the layer according to the present invention. A chromium percentage of 40 at % and an aluminum content of 60 at % has proved itself to be advantageous. This intermediate layer has the advantage, among others, that it functions as a transition with respect to the stress and/or pressure conditions between the less brittle substrate and the extremely hard $Ti_xSi_{1-x}N$ layer having extremely high residual stresses. Flaking off is thus greatly reduced, and the layer adhesion is correspondingly improved.

In the preceding section and the following description, x is the concentration of Ti expressed in at % and y is the Cr concentration expressed in at %, when only the metallic elements are taken into consideration.

Such double layers having different Si contents were tested on tools, it was measured how many meters a corresponding tool can machine without being significantly damaged. The machining tests were carried out under the following conditions: workpiece steel DIN 1.2379, hardened to 69HRC, tool diameter 2 mm solid cemented-carbide spherical-head milling cutter, cutting speed 110 m/min, feed per tooth 0.04 mm, axial infeed 0.1 mm, radial infeed 0.04 mm. Tools coated with the usual commercially available coating survived for just over 60 m. In contrast, tools coated with the above-described double layer, wherein the outer layer contains at least 10% silicon, survived for more than 100 m. The interesting fact is that the CrAlN layer should be kept relatively thin. This seems to indicate that the CrAlN layer essentially takes on the role of an adhesive layer.

According to a further advantageous embodiment, a transition layer is provided between the CrAlN intermediate layer and the $Ti_xSi_{1-x}$ layer, the transition layer being produced by means of co-sputtering. With the above-described sputtering method, co-sputtering can be reliably performed in such a way that, for example, the pulse widths for the different targets are selected in such a way that the maxima of the reactive gas consumption curves as a function of the pressure present in the coating chamber essentially overlie each other. This is possible because the pulse duration directly influences the position of the corresponding maxima. This is shown, for example, in FIG. 6, where three different pulse durations (0.05 ms, 0.2 ms and 2 ms) were used for sputtering. In this way it is possible to optimally operate both targets at the same pressure present in the chamber and under the same gas flow conditions.

According to a further embodiment of the present invention, the transition layer is implemented as a graded layer, having a decreasing content of CrAlN and an increasing content of $Ti_xSi_{1-x}N$ as the distance from the substrate suffice increases.

According to a further embodiment of the present invention, the final $Ti_xSi_{1-x}N$ layer is not a pure $Ti_xSi_{1-x}N$ layer but also contains a certain proportion of CrAlN.

The invention also specifically refers to a workpiece having a coating, said coating comprising at least one $Ti_xSi_{1-x}N$ layer, characterized in that $x \leq 0.85$ and the $Ti_xSi_{1-x}N$ layer contains nanocrystals and the nanocrystals present have an average grain size of not more than 15 nm and preferably have a (200) texture. The invention also relates to a method for coating a workpiece with a coating comprising at least the above-mentioned $Ti_xSi_{1-x}N$ layer, wherein the method used for producing the $Ti_xSi_{1-x}N$ layer is a sputtering method, in which at least one $Ti_xSi_{1-x}$ target is used as a sputtering target, wherein $x \leq 0.85$ in at % and wherein current densities of at least 0.2 A/cm$^2$, preferably more than 0.2 A/cm$^2$, arise on the target surface of the sputtering target. Preferably an intermediate layer containing TiAlN or CrAlN or TiAlN and CrAlN is provided between the $Ti_xSi_{1-x}N$ layer and the substrate body of the workpiece.

According to a preferred embodiment of a method for coating a workpiece according to the present invention, in which a transition layer is to be deposited, the transition layer is produced by means of co-sputtering.

If it is advantageous for certain applications, the $Ti_xSi_{1-x}N$ layer according to the present invention can also contain TiAlN or CrAlN or TiAlN and CrAlN percentages.

Depending on the application, it is also possible to use other metal nitride or metal nitride-based materials for coating in the above mentioned embodiments of the present invention instead of TiAlN or CrAlN, in order to achieve the desired layer properties.

The invention claimed is:

1. A method for coating a workpiece having a coating comprising at least one $Ti_xSi_{1-x}N$ layer, wherein $x \leq 0.85$ and the $Ti_xSi_{1-x}N$ layer contains nanocrystals and the nanocrystals present have an average grain size of not more than 15 nm, wherein x is the concentration of Ti expressed in at % when only metallic elements are taken into consideration, the method comprising:

using a sputtering process to produce the $Ti_xSi_{1-x}N$ layer as a nanocrystalline layer, wherein in the sputtering process a power source constantly outputs high power, and in which a plurality of sputtering cathodes are used, wherein a full power of the power source and thus a high power density is initially only applied to a first sputtering cathode, and subsequently a second sputtering cathode is connected to an output of the power source, and wherein TiSi targets are operated as sputtering cathodes, wherein current densities of at least 0.2 A/cm$^2$ arise on the target surface of the sputtering target, and wherein the TiSi targets which are operated for producing the nanocrystalline layer have a silicon content of equal to or greater than 15 at %.

2. The method for coating a workpiece according to claim 1, further comprising providing an intermediate layer containing TiAlN between the $Ti_xSi_{1-x}N$ layer and the substrate body of the workpiece.

3. The method for coating a workpiece according to claim 2, further comprising providing a transition layer containing both TiAlN and $Ti_xSi_{1-x}N$ between the intermediate layer and the $Ti_xSi_{1-x}N$ layer.

4. The method for coating a workpiece according to claim 3, wherein the transition layer is a graded layer having a silicon content that increases as distance from the substrate surface increases.

5. The method for coating a workpiece according to claim 1, further comprising providing an intermediate layer containing $Cr_yAl_{1-y}N$ between the $Ti_xSi_{1-x}N$ layer and the substrate body of the workpiece, wherein y indicates the Cr concentration expressed in at %, when only the metallic elements are taken into consideration.

6. The method for coating a workpiece according to claim 5, further comprising providing a transition layer containing both $Cr_yAl_{1-y}N$ and $Ti_xSi_{1-x}N$ between the intermediate layer and the $Ti_xSi_{1-x}N$ layer.

7. The method for coating a workpiece according to claim 6, wherein the transition layer is a graded layer having a silicon content that increases as distance from the substrate surface increases.

8. The method for coating a workpiece according to claim 1, further comprising producing a transition layer between an intermediate layer and the $Ti_xSi_{1-x}N$ layer by co-sputtering.

* * * * *